(12) United States Patent
Ackenhausen et al.

(10) Patent No.: US 11,643,105 B2
(45) Date of Patent: May 9, 2023

(54) SYSTEMS AND METHODS FOR GENERATING SIMULATION SCENARIO DEFINITIONS FOR AN AUTONOMOUS VEHICLE SYSTEM

(71) Applicant: Argo AI, LLC, Pittsburgh, PA (US)

(72) Inventors: Thomas Carl Ackenhausen, Ann Arbor, MI (US); Patrick Michael Carmody, Dexter, MI (US); Albert Costa, Pittsburgh, PA (US); Alexander Allen Nolley, Berkley, MI (US)

(73) Assignee: Argo AI, LLC, Pittsburgh, PA (US)

( * ) Notice: Subject to any disclaimer, the term of this patent is extended or adjusted under 35 U.S.C. 154(b) by 561 days.

(21) Appl. No.: 16/797,103

(22) Filed: Feb. 21, 2020

(65) Prior Publication Data
US 2021/0261156 A1 Aug. 26, 2021

(51) Int. Cl.
*G05D 1/02* (2020.01)
*B60W 60/00* (2020.01)
(Continued)

(52) U.S. Cl.
CPC .... *B60W 60/0011* (2020.02); *B60W 60/0025* (2020.02); *G06F 16/1734* (2019.01); *G06F 16/9035* (2019.01); *G06F 30/20* (2020.01)

(58) Field of Classification Search
CPC ........... B60W 60/0011; B60W 60/0025; G06F 16/1734; G06F 16/9035; G06F 30/20; G06F 11/3684; G06V 20/58
See application file for complete search history.

(56) References Cited

U.S. PATENT DOCUMENTS

| 7,693,624 B2 | 4/2010 | Duggan et al. |
| 9,612,123 B1 | 4/2017 | Levinson et al. |

(Continued)

FOREIGN PATENT DOCUMENTS

| CA | 3052234 A1 | 8/2018 |
| CN | 108292474 A | 7/2018 |

(Continued)

OTHER PUBLICATIONS

U.S. Appl. No. 17/074,807, filed Oct. 20, 2020, In-Vehicle Operation of Simulation Scenarios During Autonomous Vehicle Runs.
(Continued)

*Primary Examiner* — Masud Ahmed
(74) *Attorney, Agent, or Firm* — Fox Rothschild, LLP

(57) ABSTRACT

A system of creating a simulation scenario definition to simulate behavior of an autonomous vehicle includes a computing device and a computer-readable storage medium having one or more programming instructions. The system identifies an event on which a simulation scenario definition is to be based, identifies one or more log files associated with the event, parses the one or more log files in a time-sequential order and populates the simulation scenario definition with information from the identified log files until an event trigger is detected, identifies an actor from one or more of the log files, infer a shape of the actor, generates one or more simulated tracks that includes the inferred shape for the actor, and adds the simulated tracks to the simulation scenario definition.

25 Claims, 9 Drawing Sheets

(51) Int. Cl.
  *G06F 16/9035* (2019.01)
  *G06F 16/17* (2019.01)
  *G06F 30/20* (2020.01)

(56) References Cited

U.S. PATENT DOCUMENTS

| | | | |
|---|---|---|---|
| 9,836,895 | B1 | 12/2017 | Nygaard et al. |
| 10,002,471 | B2 | 6/2018 | Blayvas et al. |
| 10,019,011 | B1 | 7/2018 | Green et al. |
| 10,031,526 | B1 | 7/2018 | Li et al. |
| 10,156,848 | B1 | 12/2018 | Konrardy et al. |
| 10,395,433 | B2 | 8/2019 | Tomatsu |
| 10,453,260 | B2 | 10/2019 | Alaniz et al. |
| 10,482,003 | B1 | 11/2019 | Bondor et al. |
| 10,852,721 | B1* | 12/2020 | Smith ............... G05D 1/0022 |
| 11,409,304 | B1* | 8/2022 | Cai ................... G05D 1/0251 |
| 2005/0209983 | A1 | 9/2005 | MacPherson |
| 2008/0040004 | A1 | 2/2008 | Breed |
| 2008/0040029 | A1 | 2/2008 | Breed |
| 2010/0115411 | A1 | 5/2010 | Sorokin et al. |
| 2011/0167574 | A1 | 7/2011 | Stout et al. |
| 2011/0305183 | A1 | 12/2011 | Hsu et al. |
| 2014/0289174 | A1 | 9/2014 | Statnikov et al. |
| 2014/0309789 | A1 | 10/2014 | Ricci |
| 2016/0314224 | A1 | 10/2016 | Wei et al. |
| 2017/0113664 | A1 | 4/2017 | Nix |
| 2017/0267233 | A1 | 9/2017 | Minster et al. |
| 2018/0107770 | A1 | 4/2018 | Cahoon et al. |
| 2018/0188727 | A1 | 7/2018 | Zhuang et al. |
| 2018/0365888 | A1 | 12/2018 | Satzoda et al. |
| 2019/0004528 | A1 | 1/2019 | Zhan et al. |
| 2019/0228118 | A1 | 7/2019 | Hummelshoj |
| 2019/0250622 | A1 | 8/2019 | Nister et al. |
| 2019/0301886 | A1 | 10/2019 | Elangovan et al. |
| 2019/0354643 | A1 | 11/2019 | Shum et al. |
| 2019/0377351 | A1 | 12/2019 | Phillips et al. |
| 2020/0050536 | A1* | 2/2020 | Nygaard ............ G06F 11/3684 |
| 2020/0082248 | A1* | 3/2020 | Villegas ............... B60W 40/02 |
| 2020/0192391 | A1 | 6/2020 | Vora et al. |
| 2020/0209874 | A1 | 7/2020 | Chen et al. |
| 2020/0218979 | A1 | 7/2020 | Kwon et al. |
| 2020/0226225 | A1* | 7/2020 | Zaytsev ................ G07C 5/008 |
| 2020/0283016 | A1* | 9/2020 | Blaiotta ............... G06V 20/58 |
| 2020/0284883 | A1 | 9/2020 | Ferreira et al. |
| 2020/0309561 | A1 | 10/2020 | Li et al. |
| 2020/0341466 | A1 | 10/2020 | Pham et al. |
| 2020/0409369 | A1 | 12/2020 | Zaytsev et al. |
| 2021/0053563 | A1* | 2/2021 | Li ........................ B60W 30/09 |
| 2021/0096566 | A1* | 4/2021 | Wang .................. B60W 30/09 |
| 2021/0108936 | A1 | 4/2021 | Seegmiller et al. |
| 2021/0132604 | A1 | 5/2021 | Gillett |
| 2021/0309248 | A1 | 10/2021 | Choe et al. |
| 2021/0350046 | A1 | 11/2021 | Bosson et al. |

FOREIGN PATENT DOCUMENTS

| | | |
|---|---|---|
| WO | 2015173903 A1 | 11/2015 |
| WO | 20180204544 A1 | 11/2018 |

OTHER PUBLICATIONS

U.S. Appl. No. 16/797,109, filed Feb. 21, 2020, Play-Forward Planning and Control System for an Autonomous Vehicle.

U.S. Appl. No. 17/178,333, filed Feb. 18, 2021, Rare Event Simulation in Autonomous Vehicle Motion Planning.

van der Made, R. et al., "Automated Generation of Virtual Driving Scenarios from Test Drive Data", 24th International Technical Conference on the enhanced Safety of Vehicles (ESV), Jun. 8, 2015-Jun. 11, 2015.

Rocklage, E. et al., "Automated Scenario Generation for Regression Testing of Autonomous Vehicles", 2017 IEEE 20th International Conference on Intelligent Transportation Systems (ISC): Workshop.

Guldogus, M., "Proof of Concept of Closed Loop Re-Simulation (CLR) Methods in Verification of Autonomous Vehicles", KTH Schoold of Electrical Engineering (EES), Master's Thesis, 2017.

Markkula, G., "Driver behavior models for evaluating automotive active safety", Department of Applied Mechanics, Chalmers University of Technology, Goteborg, Sweden 2015.

NVIDIA Self-Driving Safety Report, 2018.

Coelingh, E. et al., "Creating Driving Tests for Self-Driving Cars," IEEE Spectrum, Feb. 2018.

Liu, H. et al., "Real World Meets Virtual World: Augmented Reality Makes Driverless Vehicle Testing Faster, Safer and Cheaper," University of Michigan, pp. 1-8, Nov. 2018.

Stackpole, B. "Mcity Adds Augmented Reality to Driverless Car Testing Roadmap," Digital Engineering 247, Dec. 2018.

Gonzalez, D. et al., "A Review of Motrion Planning Techniques for Automated Vehicles," IEEE Transactions on Intelligent, Transportation Systems, vol. 17, No. 4, pp. 1135-1145, Apr. 2016.

Yurtsever, E., et al., "A Survey of Autonomous Driving: Common Practices and Emerging Technologies," IEEE Access, vol. 8, [cs. RO], Apr. 2020.

"We Deliver the Promise of Autonomy," https://edge-case-research. com/products-services/, Oct. 14, 2020.

Bolte, J.A. et al. "Towards Corner Case Detection for Autonomous Driving," arXiv:1902.09184vs [cs:CV] Feb. 26, 2019.

Koopman, P. "Edge Cases and Autonomoous Vehicle Safety," Edge Case Research, SSS 2019, Bristol, Feb. 7, 2019.

Beck, J. et al. "Rare-Event Simulation," Springer International Publishing Switzerland 2015 R. Ghanem et al. (eds.), Handbook of Uncertainty Quantification, DOI 10.1007/978-3-319-11259-6_24-1, pp. 1-26.

\* cited by examiner

SYSTEMS AND METHODS FOR GENERATING SIMULATION SCENARIO DEFINITIONS FOR AN AUTONOMOUS VEHICLE SYSTEM

BACKGROUND

When an encounter of interest is identified during operation of an autonomous vehicle, it is desirable to capture the details of this encounter as a simulation scenario definition which can be used to recreate a virtual version of the encounter for analysis and validation of the autonomous vehicle's ability to navigate the encounter. Tools exist to facilitate manually creating a scenario to reproduce the events of an encounter. However, this can be a slow and tedious process, especially for complex encounters. In addition, reproducing events in this manner can result in a less accurate reproduction.

SUMMARY

In an embodiment, a system of creating a simulation scenario definition to simulate behavior of an autonomous vehicle includes a computing device and a computer-readable storage medium having one or more programming instructions. The one or more programming instructions, when executed, cause the computing device to identify an event on which a simulation scenario definition is to be based, identify one or more log files associated with the event, parse the one or more log files in a time-sequential order and populating the simulation scenario definition with information from the identified log files until an event trigger is detected, identify an actor from one or more of the log files, infer a shape of the actor, generate one or more simulated tracks that includes the inferred shape for the actor, and add the simulated tracks to the simulation scenario definition. The log files include data that is collected by one or more sensors of an autonomous vehicle while experiencing the event and logged by the autonomous vehicle to one or more data stores.

The system may use a simulation system to generate a data set from a simulated environment by operating a virtual vehicle in the simulated environment wherein a trajectory of the virtual vehicle is defined by the simulation scenario definition.

The system may to populate the simulation scenario definition with information from the identified log files by populating the simulation scenario definition within information pertaining to a pose of the autonomous vehicle. The system may populate the simulation scenario definition with information from the identified log files by populating the simulation scenario definition within information pertaining to a velocity of the autonomous vehicle.

The system may identify an actor from one or more of the log files by receiving an indication of the actor from a user.

The system may infer a shape of the actor by, for one or more tracks of the one or more log files that includes the actor, generating a box frame corresponding to the actor, and averaging the generated box frames to generate an average box frame associated with the actor. The average box frame may represent a first polygon.

The system may identify one or more templates. Each identified template may include shape information pertaining to a category of object. The shape information may represent a second polygon. Each identified template may include shape information pertaining to a vehicle.

The system may compare the average box frame to the shape information from one or more of the identified templates to generate a score associated with the average box frame and the template.

The system may compare the average box frame to the shape information from one or more of the identified templates to generate a score associated with the average box frame and the template by generating a score that is indicative of an area covered by a ratio of an intersection of the first polygon and the second polygon to an area covered by a union of an area of the first polygon and the second polygon.

The system may select the identified template associated with the highest score.

The system may determine whether the score associated with the selected template is below a threshold value, and in response to determining that the score associated with the selected template is below a threshold value, generate and provide a warning to a user.

The system may scale the second polygon represented by the selected template to fit the average box frame.

DETAILED DESCRIPTION

Figure 1:
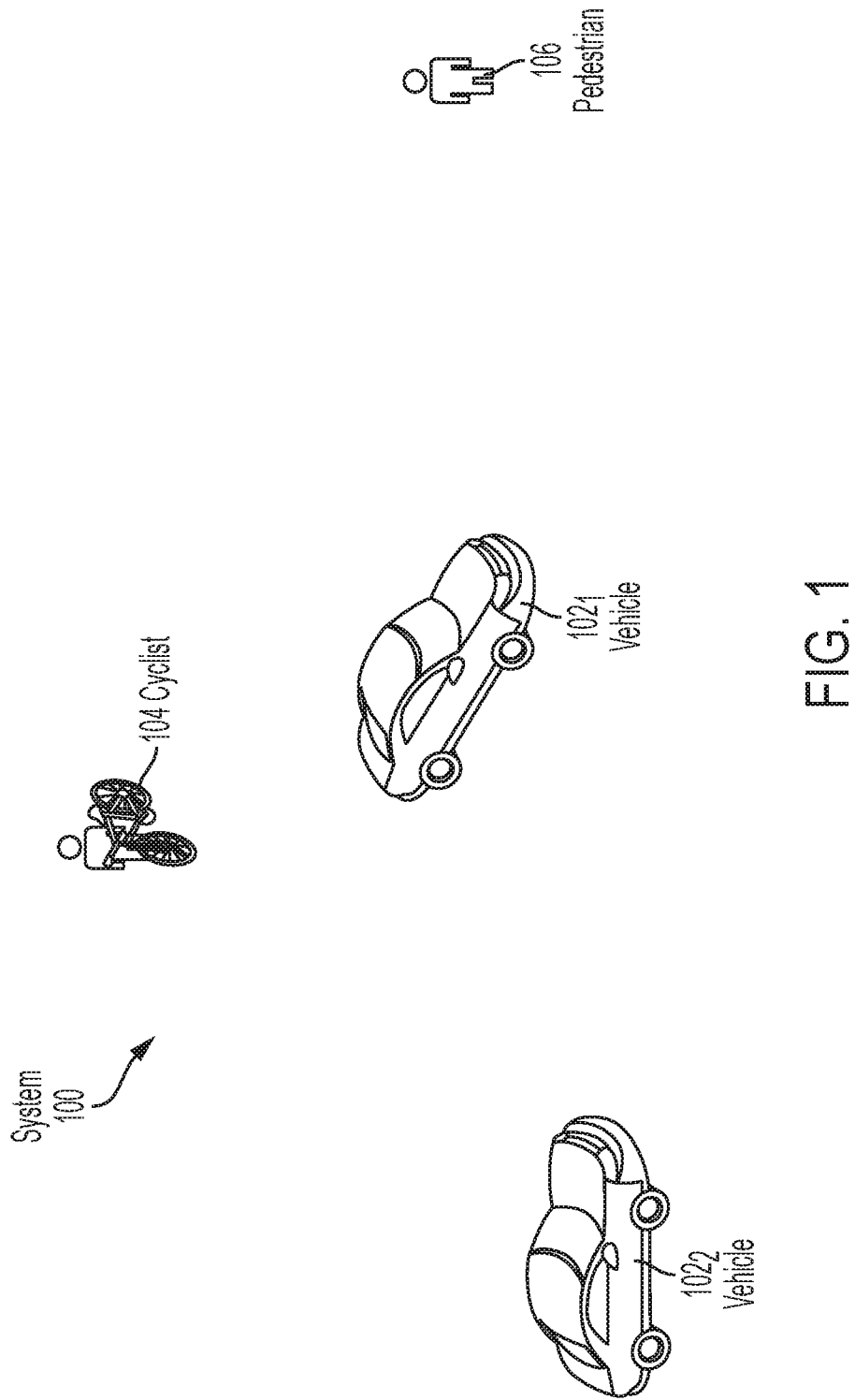
FIG. 1 illustrates an example autonomous vehicle.

FIG. 1 illustrates an example system 100 that includes a vehicle 102 that is traveling along a road in a semi-autonomous or autonomous manner. Vehicle 102 is also referred to in this document as an Autonomous Vehicle or AV. The AV 102 can include, but is not limited to, a land vehicle (as shown in FIG. 1) such as an automobile, truck or van; an aircraft; or a watercraft.

Figure 2:
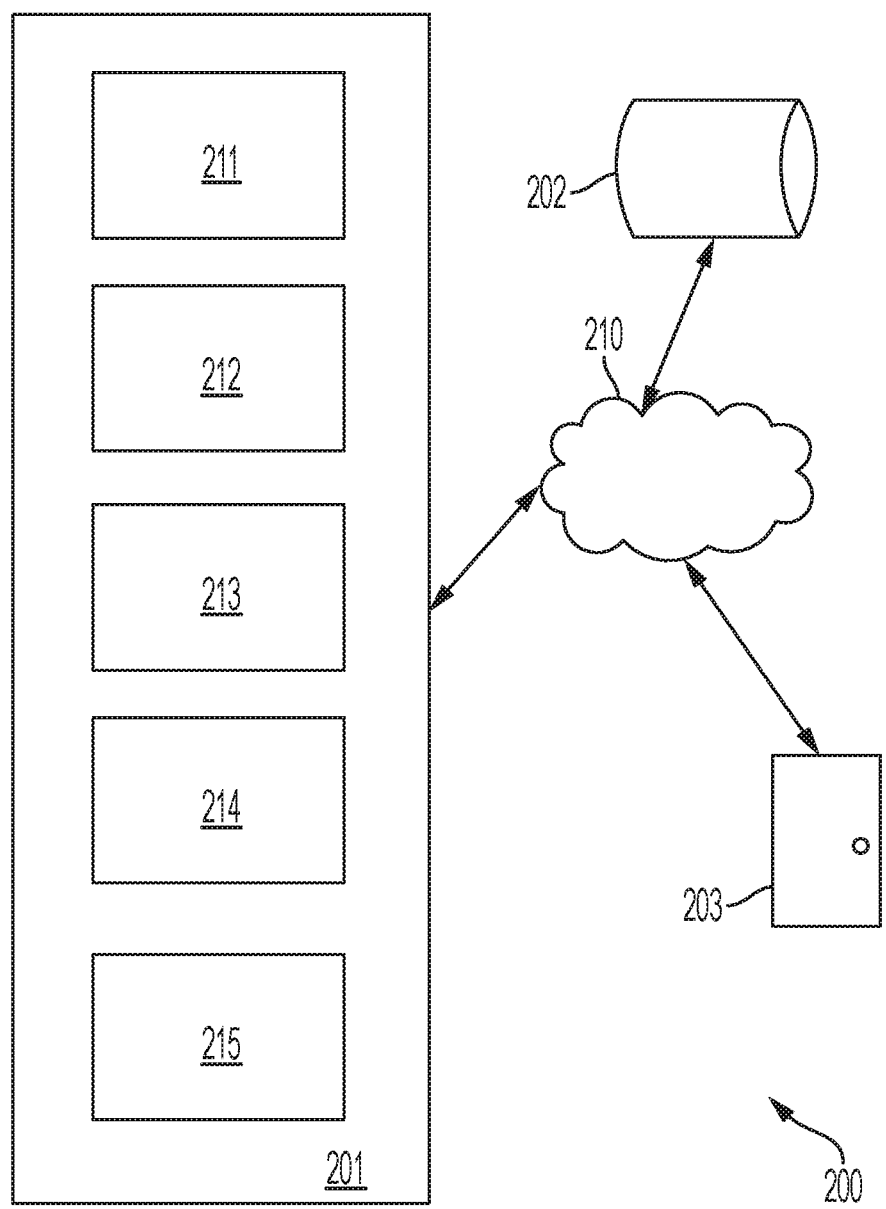
FIG. 2 illustrates an example system that includes an autonomous vehicle.

FIG. 2 illustrates an example system architecture 200 for a vehicle, such as an AV. AV 102 of FIG. 1 can have the same or similar system architecture as that shown in FIG. 2. Thus, the following discussion of system architecture 200 is sufficient for understanding vehicle 102 of FIG. 1.

FIG. 2 is a block diagram illustrating an example system 200 that includes an autonomous vehicle 201 in communication with one or more data stores 202 and/or one or more servers 203 via a network 210. Although there is one autonomous vehicle shown, multiple autonomous vehicles may be coupled to each other and/or coupled to data stores 202 and/or servers 203 over network 210. Network 210 may be any type of network such as a local area network (LAN), a wide area network (WAN) such as the Internet, a cellular network, a satellite network, or a combination thereof, and may be wired or wireless. Data store(s) 202 may be any kind of data stores such as, without limitation, map data stores, traffic information data stores, user information data stores, point of interest data store(s), or any other type of content data store(s). Server(s) 203 may be any kind of servers or a cluster of servers, such as, without limitation, Web or cloud servers, application servers, backend servers, or a combination thereof.

As illustrated in FIG. 2, the autonomous vehicle 201 may include a sensor system 211, a vehicle controller 212, a vehicle control system 213, a communications interface 214, and a user interface 215. Autonomous vehicle 201 may further include certain components (not shown here) included in vehicles, such as, an engine, wheels, steering wheel, transmission, etc., which may be controlled by vehicle control system 212 using a variety of communication signals and/or commands, such as, for example, acceleration signals or commands, deceleration signals or commands, steering signals or commands, braking signals or commands, etc.

The sensor system 211 may include one or more sensors that are coupled to and/or are included within the autonomous vehicle 201. Examples of such sensors include, without limitation, a Light Detection and Ranging (LiDAR) system, a Radio Detection and Ranging (RADAR) system, one or more cameras (e.g., visible spectrum cameras, infrared cameras, etc.), temperature sensors, position sensors, location sensors (e.g., global positioning system (GPS), etc.), clocks, fuel sensors, speed sensors, odometer sensor, motion sensors (e.g., inertial measurement units (IMU), accelerometer, gyroscope, etc.), object detection sensors such as one or more cameras, humidity sensors, environmental sensors (e.g., a precipitation sensor and/or ambient temperature sensor) occupancy sensors, or the like. The sensor data can include information that describes the location of objects within the surrounding environment of the autonomous vehicle 102, information about the environment itself, information about the motion of the autonomous vehicle 102, information about a route of the autonomous vehicle, or the like.

Figure 3:
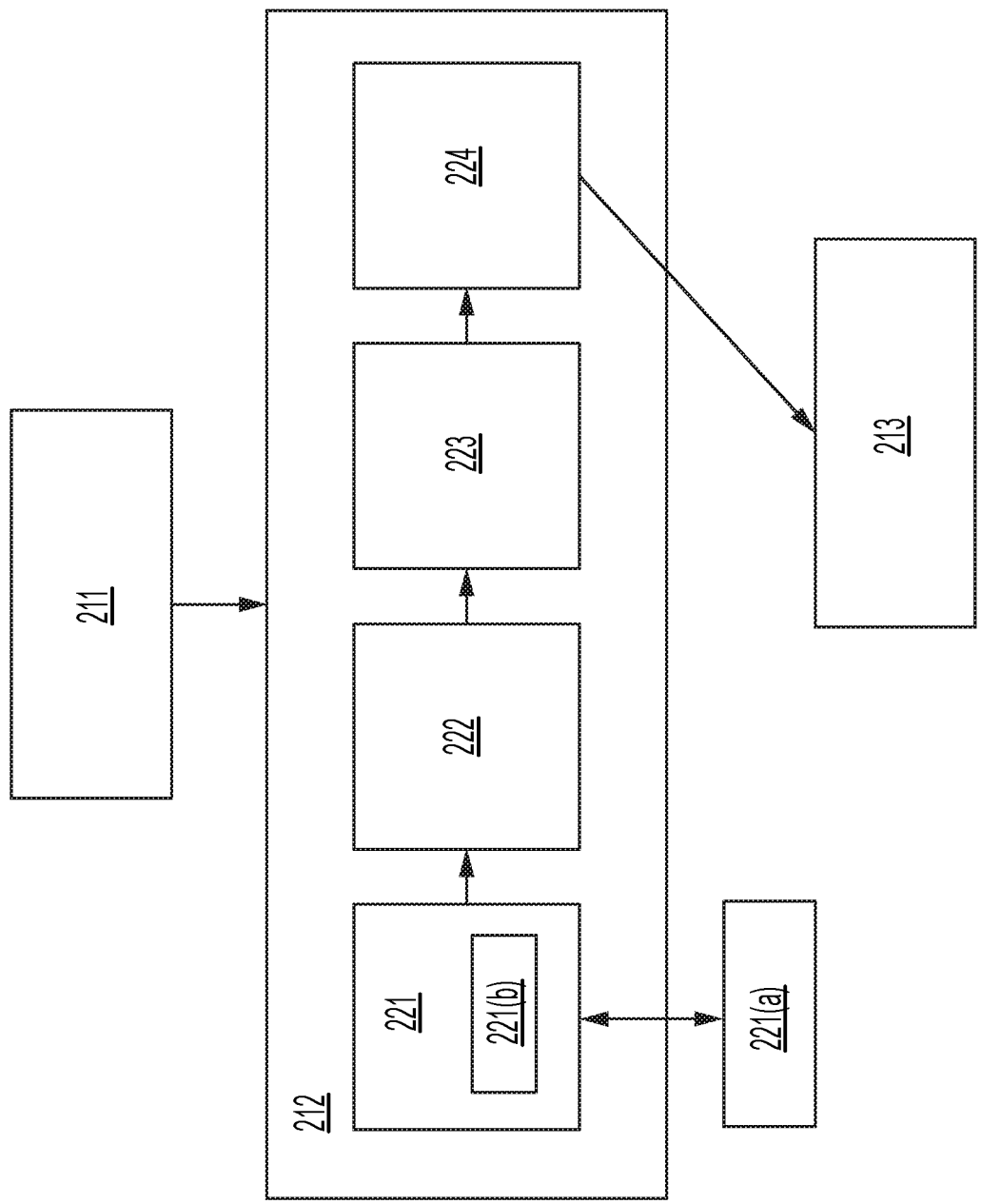
FIG. 3 illustrates a block diagram of various components of an example controller of an autonomous vehicle.

As shown in FIG. 3, the vehicle controller 212 may receive data collected by the sensor system 211 and analyze it to provide one or more vehicle control instructions to the vehicle control system 213. The vehicle controller 212 may include, without limitation, a location subsystem 221, a perception subsystem 222, a prediction subsystem 223, and a motion planning subsystem 224.

The location subsystem 221 may include and/or may retrieve map data from a map data store 221(*a*) that provides detailed information about the surrounding environment of the autonomous vehicle. The map data can provide information regarding: the identity and location of different roadways, road segments, buildings, or other items; the location and directions of traffic lanes (e.g., the location and direction of a parking lane, a turning lane, a bicycle lane, or other lanes within a particular roadway); traffic control data (e.g., the location and instructions of signage, traffic lights, or other traffic control devices); and/or any other map data that provides information that assists the vehicle controller 212 in analyzing the surrounding environment of the autonomous vehicle. In certain embodiments, the map data may also include reference path information that correspond to common patterns of vehicle travel along one or more lanes such that the motion of the object is constrained to the reference path (e.g., locations within traffic lanes on which an object commonly travels). Such reference paths may be pre-defined such as the centerline of the traffic lanes. Optionally, the reference path may be generated based on a historical observations of vehicles or other objects over a period of time (e.g., reference paths for straight line travel, lane merge, a turn, or the like).

In certain embodiments, the location subsystem 221 may also include and/or may receive information relating to the trip or route of a user, real-time traffic information on the route, or the like.

The location subsystem 221 may include and/or may be in communication with a routing module 221(*b*) that generates a navigation route from a start position to a destination position for an autonomous vehicle. The routing module 212(*b*) may access the map data store 212(*a*) to identify possible routes and road segments that a vehicle can travel on to get from the start position to the destination position. The routing module 212(*b*) may score the possible routes and identify a preferred route to reach the destination. For example, the routing module 212(*b*) may generate a navigation route that minimizes Euclidean distance traveled or other cost function during the route, and may further access the traffic information and/or estimates that can affect an amount of time it will take to travel on a particular route. Depending on implementation, the routing module 212(*b*) may generate one or more routes using various routing methods, such as Dijkstra's algorithm, Bellman-Ford algorithm, or other algorithms. The routing module 212(*b*) may also use the traffic information to generate a navigation route that reflects expected conditions of the route (e.g., current day of the week or current time of day, etc.), such that a route generated for travel during rush-hour may differ from a route generated for travel late at night. The routing module 212(*b*) may also generate more than one navigation route to a destination and send more than one of these navigation routes to a user for selection by the user from among various possible routes.

Based on the sensor data provided by sensor system 211 and information obtained by the location subsystem 221, the perception subsystem 222 may determine perception information of the surrounding environment of the autonomous vehicle 201 during travel from the start position to the destination along the preferred route. The perception information may represent what an ordinary driver would perceive in the surrounding environment of a vehicle. The perception data may include information relating to one or more objects in the environment of the autonomous vehicle 201. For example, the perception subsystem 222 may process sensor data (e.g., LiDAR or RADAR data, camera images, etc.) in order to identify objects and/or features in the environment of autonomous vehicle. The objects may include traffic signals, roadway boundaries, other vehicles, pedestrians, and/or obstacles, etc. The perception subsystem 222 may use any now or hereafter known object recognition algorithms, video tracking algorithms, and computer vision algorithms (e.g., track objects frame-to-frame iteratively over a number of time periods) to determine the perception.

In some embodiments, the perception subsystem 222 may also determine, for one or more identified objects in the environment, the current state of the object. The state information may include, without limitation, for each object: current location; current speed and/or acceleration, current heading; current orientation; size/footprint; type (e.g., vehicle vs. pedestrian vs. bicycle vs. static object or obstacle); and/or other state information.

The prediction subsystem 223 may predict the future locations, trajectories, and/or actions of the objects based at least in part on perception information (e.g., the state data for each object) received from the perception subsystem 222, the location information received from the location subsystem 221, the sensor data, and/or any other data that describes the past and/or current state of the objects, the autonomous vehicle 201, the surrounding environment, and/or their relationship(s).

The motion planning subsystem 224 may determine a motion plan for the autonomous vehicle based on the perception data and/or the prediction data. Specifically, given predictions about the future locations of proximate objects and other perception data, the motion planning subsystem 224 can determine a motion plan for the autonomous vehicle 201 that best navigates the autonomous vehicle 201 relative to the objects at their future locations.

In one or more embodiments, the motion planning subsystem 224 may receive the predictions from the prediction 223 and make a decision regarding how to handle objects in the environment of the autonomous vehicle 201. For example, for a particular object (e.g., a vehicle with a given speed, direction, turning angle, etc.), motion planning subsystem 224 decides whether to overtake, yield, stop, and/or pass based on, for example, traffic conditions, map data, state of the autonomous vehicle, etc. In some embodiments, for a given object, the motion planning subsystem 224 may decide what to do with the object and may determine how to do it. For example, for a given object, the motion planning subsystem 224 may decide to pass the object, and then may determine whether to pass on the left side or right side of the object (including motion parameters such as speed, and lane change decisions). The motion planning subsystem 224 may also assess the risk of a collision between a detected object and the autonomous vehicle 201. If the risk exceeds an acceptable threshold, it may determine whether the collision can be avoided if the autonomous vehicle follows a defined vehicle trajectory and/or implements one or more dynamically generated emergency maneuvers is performed in a pre-defined time period (e.g., N milliseconds). If the collision can be avoided, then the controller 220 may transmit appropriate control instructions to the vehicle control system 213 for execution to perform a cautious maneuver (e.g., mildly slow down, accelerate, change lane, or swerve). In contrast, if the collision cannot be avoided, then the controller 220 may transmit appropriate control instructions to the vehicle control system 213 for execution of an emergency maneuver (e.g., brake and/or change direction of travel).

Furthermore, the motion planning subsystem 224 also plans a trajectory ("trajectory generation") for the autonomous vehicle 201 to travel on a given route (e.g., a nominal route generated by the routing module 212(b)). The trajectory specifies the spatial path for the autonomous vehicle as well as a velocity profile. The controller converts the trajectory into control instructions for the vehicle control system, including but not limited to throttle/brake and steering wheel angle commands. Trajectory generation may involve making decisions relating to lane changes, such as, without limitation, whether a lane change is required, where to perform a lane change, and when to perform a lane change. Specifically, one objective of the motion planning subsystem 224 is to generate a trajectory for motion of the vehicle from a start position to a destination on the nominal route, taking into account the perception and prediction data.

The motion planning subsystem 224 may generate the trajectory by performing topological planning to generate a set of constraints for each of a plurality of topologically distinct classes of trajectories, optimizing a single candidate trajectory for each class, and scoring the candidate trajectories to select an optimal trajectory. Topological classes are distinguished by the discrete actions taken with respect obstacles or restricted map areas. Specifically, all possible trajectories in a topologically distinct class takes the same action with respect to obstacles or restricted map areas. Obstacles may include, for example, static objects such as traffic cones and bollards, or other road users such as pedestrians, cyclists, and cars. Restricted map areas may include, for example, crosswalks and intersections. Discrete actions may include, for example, to stop before or proceed through, to track ahead or behind, or to pass on the left or right of something.

The motion planning subsystem may use the preferred route information provided by the routing module 212(b) in combination with perception data, prediction data to select the optimal trajectory, as discussed below.

As discussed above, planning and control data regarding the movement of the autonomous vehicle is generated by the motion planning subsystem 224 of the controller 220 that is transmitted to the vehicle control system 213 for execution. The vehicle control system 213 may, for example, control braking via a brake controller; direction via a steering controller; speed and acceleration via a throttle controller (in a gas-powered vehicle) or a motor speed controller (such as a current level controller in an electric vehicle); a differential gear controller (in vehicles with transmissions); and/or other controllers.

In the various embodiments discussed in this document, the description may state that the vehicle or a controller included in the vehicle (e.g., in an on-board computing system) may implement programming instructions that cause the controller to make decisions and use the decisions to control operations of one or more vehicle systems via the vehicle control system of the vehicle. However, the embodiments are not limited to this arrangement, as in various embodiments the analysis, decision making and or operational control may be handled in full or in part by other computing devices that are in electronic communication with the vehicle's on-board controller and/or vehicle control system. Examples of such other computing devices include an electronic device (such as a smartphone) associated with a person who is riding in the vehicle, as well as a remote server that is in electronic communication with the vehicle via a wireless communication network. The processor of any such device may perform the operations that will be discussed below.

Referring back to FIG. 2, the communications interface 214 may be configured to allow communication between autonomous vehicle 201 and external systems, such as, for example, external devices, sensors, other vehicles, servers, data stores, databases etc. Communications interface 214 may utilize any now or hereafter known protocols, protection schemes, encodings, formats, packaging, etc. such as, without limitation, Wi-Fi, an infrared link, Bluetooth, etc. User interface system 215 may be part of peripheral devices implemented within vehicle 201 including, for example, a keyword, a touch screen display device, a microphone, and a speaker, etc.

In the various embodiments discussed in this document, the description may state that the vehicle or on-board computing device of the vehicle may implement programming instructions that cause the on-board computing device of the vehicle to make decisions and use the decisions to control operations of one or more vehicle systems. However, the embodiments are not limited to this arrangement, as in various embodiments the analysis, decision-making and or operational control may be handled in full or in part by other computing devices that are in electronic communication with the vehicle's on-board computing device. Examples of such other computing devices include an electronic device (such as a smartphone) associated with a person who is riding in the vehicle, as well as a remote server that is in electronic communication with the vehicle via a wireless communication network. The processor of any such device may perform the operations that will be discussed below.

As an AV progresses along a route, it may encounter a variety of different events along the way. An event refers to an action, interaction, occurrence or environmental condition that may affect operation or a decision-making process of an AV. Example events include, without limitation, a pedestrian walking in proximity to an AV, a traffic light status, a vehicle passing the AV, a vehicle turning in front of the AV, and/or the like.

Information pertaining to one or more encountered events may be captured by one or more sensors of an AV, such as, for example, one or more sensors of a vehicle's sensor system 211. Event information may include without limitation, a location of an AV at the time of an event, a pose of the AV at the time of an event, a position of one or more actors present at the event, movement information associated with the AV at the time of an event (e.g., velocity or acceleration), and/or the like. At least a portion of captured event information may be stored by an AV in one or more vehicle log files.

In various embodiments, event information may be automatically captured by one or more sensors of an AV. For example, event information may be captured at determined times or intervals, or periodically.

In various embodiments, event information may be captured by one or more sensors of an AV as part of a track. A perception subsystem may generate a track to indicate that an actor has been observed. A track may be used to track a current state of or other event information pertaining to an observed actor or object.

Event information pertaining to actors in an event (referred to in this disclosure as actor information) may be encoded in a vehicle log file as one or more tracks. A track may contain state information associated with an AV such as, for example, a position of the AV and/or a velocity of the AV. In various embodiments, each image or image region of a track may correspond to a spatial extent of an AV.

Actor information may include, without limitation, a shape and/or a pose of an actor during at least a portion of an event. This actor information may be captured at various times during the occurrence of an event.

When an event of interest is identified during operation of an autonomous vehicle, it may be desirable to capture the details of this encounter as a simulation scenario definition which can be used to recreate a virtual version of the encounter for analysis and validation of the autonomous vehicle's ability to navigate the encounter. Since details of an encounter may be captured in a vehicle's log files as described above, a simulation scenario definition may be automatically generated using the log files content.

Figure 4:
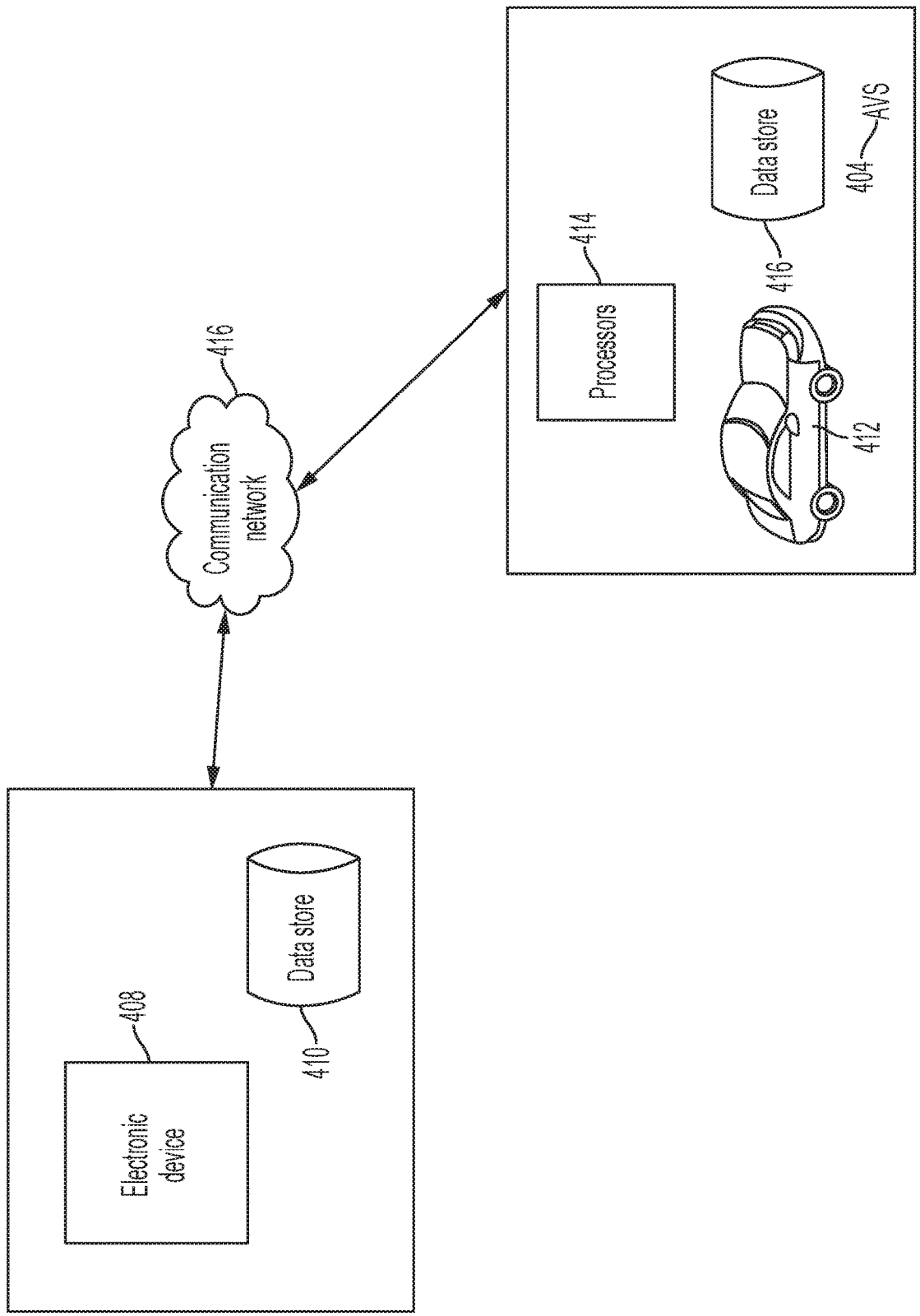
FIG. 4 illustrates an example system of creating a simulation scenario definition.

FIG. 4 illustrates an example system of creating a simulation scenario definition according to an embodiment. As illustrated by FIG. 4, the system may include a simulation system 402 in communication with an AVS 404 via one or more communication networks 406. A simulation system may include one or more electronic devices 308 and one or more data stores 410. The electronic devices 308 may be used to create, process, run, execute, store, display or otherwise exploit a simulation scenario definition.

As illustrated in FIG. 4, the AVS 404 may include an AV 412 having one or more processors 414 and having or being in communication with one or more data stores 416. One or more of the data stores 416 may store one or more of the vehicle's event log files.

Figure 5:
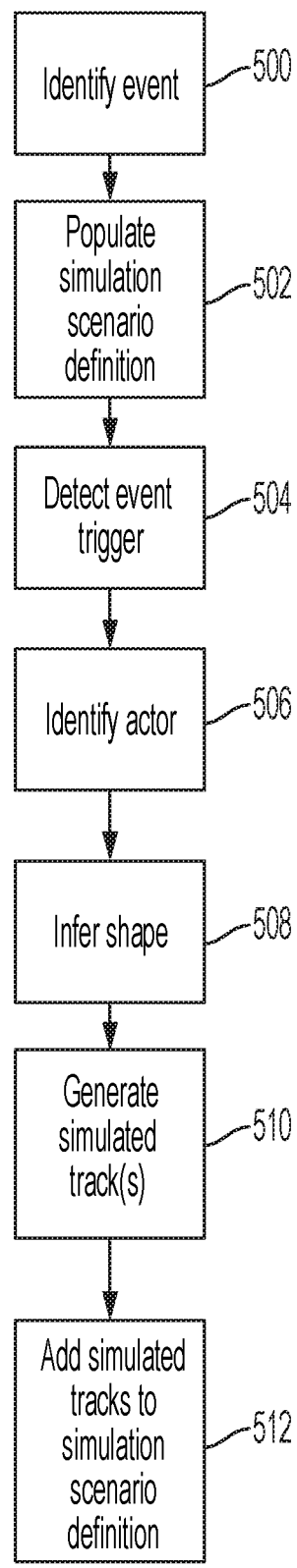
FIG. 5 illustrates an example method of creating a simulation scenario definition.

FIG. 5 illustrates an example method of creating a simulation scenario definition based on the content of one or more AV log files according to an embodiment. A simulation scenario definition refers to information or data that may be used to create or generate a virtual representation of one or more events for an AV.

A simulation system may identify 500 an event on which a simulation scenario definition will be based. An identified event may be one that an AV has experienced. As such, information pertaining to that event may be stored in the AV's log files. The event may be identified 500 based on input provided by a system user. For example, a user may identify a relevant timeframe associated with the event, such as, for example, a start time and an end time associated with the event or the portion of the event that the user would like to have included in a simulation scenario definition.

In various embodiments, a simulation system may parse one or more log files and populate 502 a simulation scenario definition with information pertaining to the event from the AV's log files. In an embodiment, a system may parse one or more log files in a time-sequential order. For example, a simulation system may determine one or more initial conditions of an AV for the event. An initial condition refers to one or more characteristics or settings associated with the AV at the start of an identified event. Examples of initial conditions may include the AV's pose, velocity and/or the like. One or more initial conditions of an AV may be determined by searching one or more log files associated with the AV for initial conditions that were logged at or in proximity to the start time of the event. The simulation system may populate 402 a simulation system definition with information that corresponds to one or more of the initial conditions. For example, the simulation system may cause a simulation scenario definition that corresponds to an event to include an AV with the same pose and velocity as the AV from the event on which the simulation scenario definition is based.

A simulation system may continue to populate 502 a simulation scenario definition with information pertaining to the event from the AV's log files until it detects 504 an event trigger. An event trigger may be an indication of at least one change to the event than that captured in the log files. For instance, an event trigger may indicate a change in point-of-view of one or more tracks which may result from the divergence of the AV's path in simulation from the path which was captured in the log. For example, at an intersection, an AV may have gone straight. As such, the tracks in its log file may capture this movement and event information pertaining to actors that it encountered on this path. However, in simulation, a system operator may wish to see how the AV would have handled turning left at the intersection.

In various embodiments, one or more event triggers may be added to log information by a system user. An event trigger may indicate an appearance of an actor, the start of a certain behavior, and/or the like. An event trigger may also indicate a change in the event that is to be simulated. One or more event triggers may assist in the coordination of state changes across actors, event changes and/or the like.

Upon detecting an event trigger, the system may identify 506 an actor from one or more tracks. An actor may be identified 506 by a system user. In a simulation scenario, one or more track instances associated with the identified actor may be converted into a behavior-controlled actor whose movements, when run in simulation, replicate the movements of the original actor in such a way that the task responsible for generating surrogate tracks in simulation will produce tracks which resemble the tracks in the original log while taking into account the necessary changes to those tracks due to differences of behavior of the situation that is being evaluated.

Figure 6:
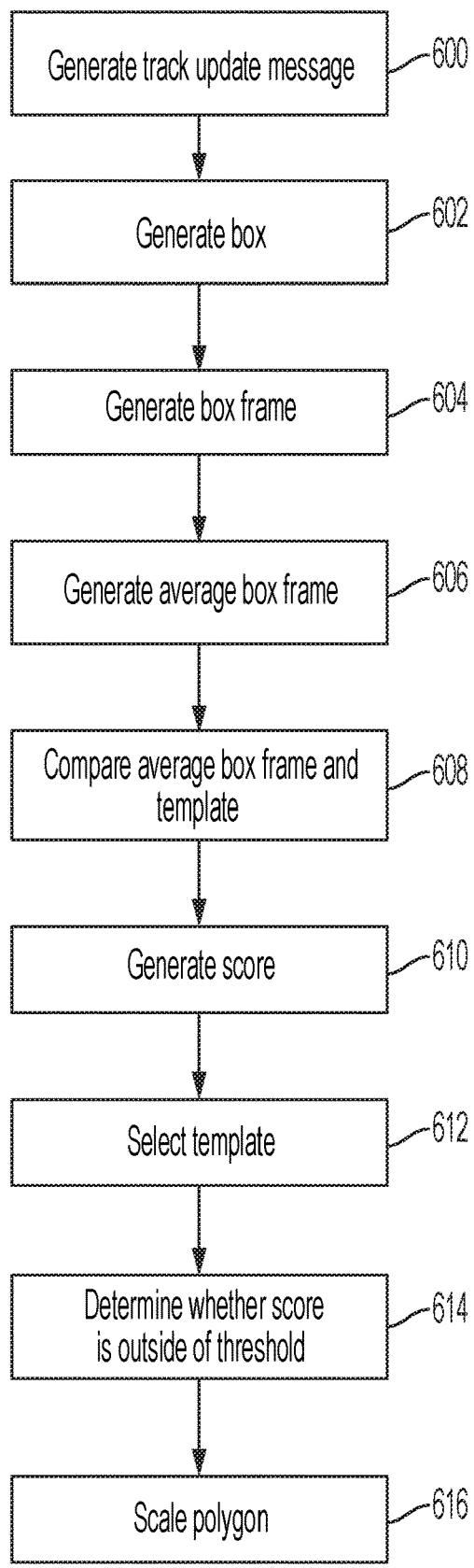
FIG. 6 illustrates an example method of inferring a shape of an actor.

To accomplish this, the system may infer 508 a shape and/or location of an actor. FIG. 6 illustrates an example method of inferring 508 a shape of an actor according to an embodiment. As illustrated by FIG. 6, the system may generate 600 one or more track update messages pertaining to an actor. A track update message may describe a current position of an actor being tracked. For example, a track update message may include a speed associated with an actor, a heading associated with an actor, a location associated with an actor, and/or the like.

In various embodiments, the system may periodically generate 600 one or more track update messages pertaining to an actor. For example, the system may generate 600 a track update message at regular intervals. As another example, the system may generate 600 a track update message when it detects that an actor's position (or component of position) has significantly changed since the previous update track message.

The system may generate 602 a box associated with the actor. A box may be a two-dimensional estimate of the true shape of an actor. A box may be generated based on at least a portion of information from one or more track update messages.

The system may generate 604 a box frame associated with the actor and that corresponds to the generated box. A box frame refers to a polygon that corresponds to a general shape of an actor. A box frame may be a linear transform that defines the corresponding box in the position and/or orientation of the tracked actor.

In various embodiments, the system may generate 604 a box frame for an actor for each track of a vehicle log in which the actor appears. In other embodiments, a user may control or adjust the actor information that is used or considered by the system. For example, a user may specify a relevant timeframe to use. In this situation, box frames may be generated for only those tracks generated during this timeframe. As another example, a user may indicate that actor information from short-lived tracks should be excluded. As such, box frames may not be generated for an actor in an excluded track. Additional and/or alternate parameters may be used within the scope of this disclosure.

As illustrated by FIG. 6, the system may generate 606 an average box frame for an actor. The system may generate 606 an average box frame by averaging the box frames across update track messages that are generated for the actor. For each update track message, the system may obtain a position of each of the four corners of a box frame from the update track message. The system may sum these positions to produce four separate sum values, one for each corner of the box frame. Each of the four sum values may be divided by the number of updated track messages involved to produce an average box frame.

As an example, the system may generate four update track messages. Each update track message may include position information for each corner of a box frame associated with an actor, as illustrated below in Table 1:

TABLE 1

| Update Track Message | Top Left Corner | Bottom Left Corner | Top Right Corner | Bottom Right Corner |
| --- | --- | --- | --- | --- |
| 1 | (2, 4) | (2, 1) | (4, 4) | (4, 1) |
| 2 | (1, 4) | (1, 1) | (3, 4) | (3, 1) |
| 3 | (2, 4) | (2, 1) | (3, 4) | (3, 1) |
| 4 | (1, 3) | (1, 1) | (4, 3) | (4, 1) |
| Sums | (6, 15) | (6, 4) | (14, 15) | (14, 4) |
| Average | (1.5, 3.75) | (1.5, 1) | (3.5, 3.75) | (3.5, 1) |

As shown in Table 1, the (x, y) values for each corner may be summed to generate a sum value for each corner. Each (x, y) value of the sum value may be divided by the number of update track messages involved to generate an average value for each corner. The average box frame may be a polygon having corners positioned at the determined average values for each. For instance, with respect to Table 1, an average box frame may have a top left corner positioned at (1.5, 3.75), a bottom left corner positioned at (1.5, 1), a top right corner positioned at (3.5, 3.75), and a bottom right corner positioned at (3.5, 1).

In various embodiments, the system may compare 608 the average box frame to one or more templates. A template refers to a set of polygon or other shape characteristics and/or relationships between or amongst such characteristics that are indicative of a particular category of object. For instance, templates may be used to classify the major types of vehicles on the road such as, for example, a car, a sports utility vehicle (SUV), a truck, a bus, and/or the like. The system may compare the average box frame to a template by aligning the minimum extents of the average box frame with the minimum extents of the template.

A minimum extent of a polygon, such as a rectangle, refers to a point that defines the smallest (x, y) values of the polygon. Aligning these extents of two polygons involves translating one polygon so that its minimum extent matches the minimum extent of the other polygon.

Figure 7A:
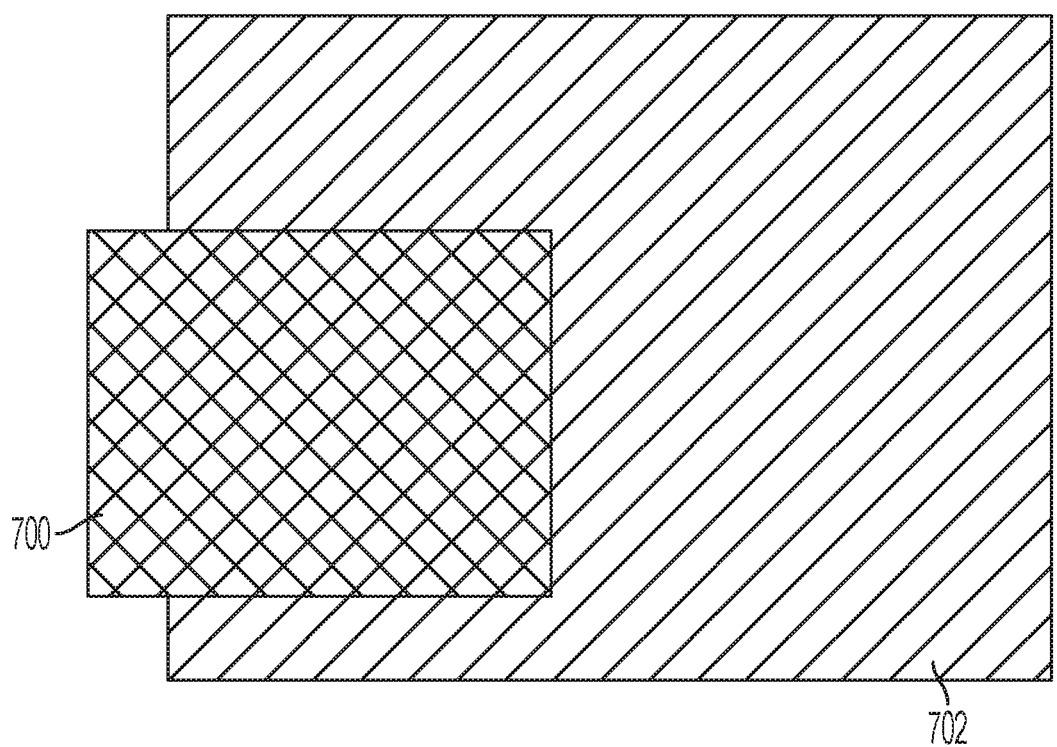
FIG. 7A illustrates an example average box frame and an example template that are not aligned.

FIG. 7A illustrates an example average box frame 700 and an example template 702 according to an embodiment. As illustrated in FIG. 7A, the average box frame 700 and the template are not aligned.

Figure 7B:
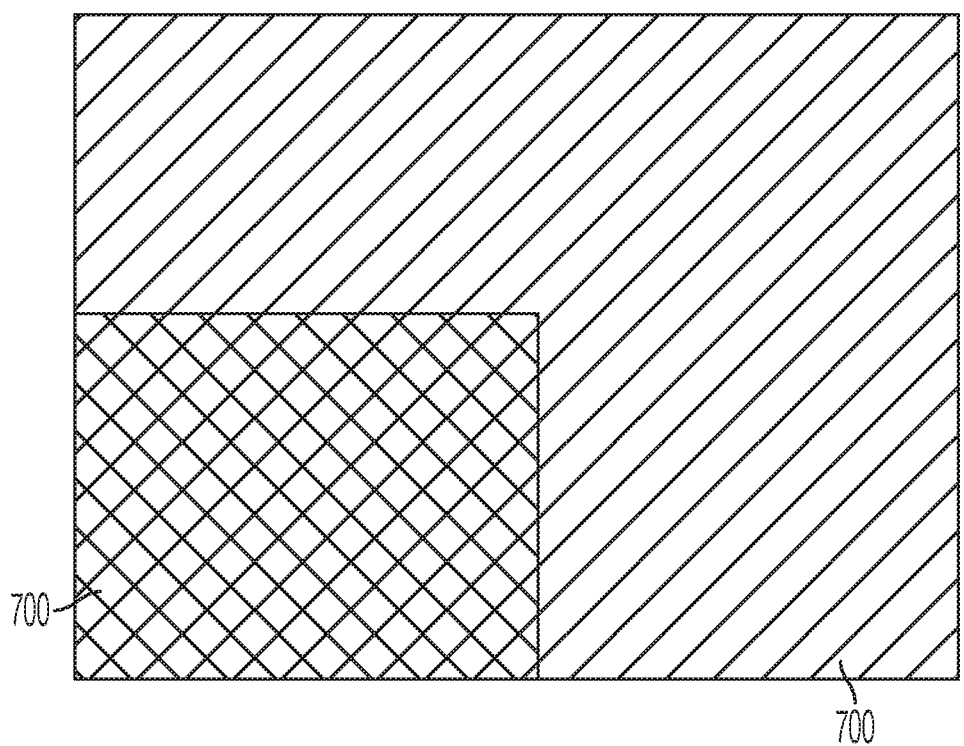
FIG. 7B illustrates an example average box frame and an example template that are in alignment.
Figure 8:
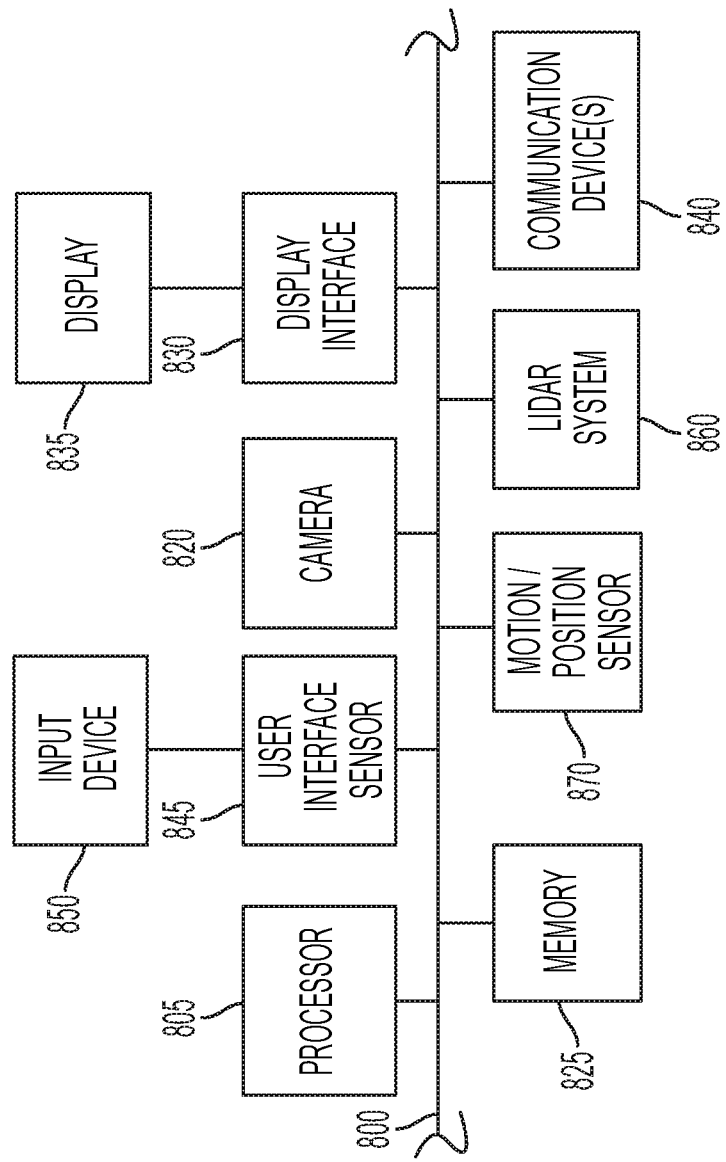
FIG. 8 illustrates various components of an example computing device.

FIG. 7B illustrates an example image of alignment of the average box frame 700 and the example template 702 from FIG. 7A. The minimum extent of both the average box frame and the template is the lower left corner of each. As such, alignment involves aligning the lower left corner of both the average box frame and the template. Alignment may be performed by calculating the difference between the minimum extents of the average box frame and the template, and using the difference to translate one of the average box frame or the template so that it aligns with the other.

Based on the comparison, the system may generate 610 a score for each template. The score may be indicative of how closely the polygon represented by a template matches the polygon represented by the average box frame. The score may be indicative of the area covered by the intersection of the polygon associated with the template and the polygon associated with the average box frame divided by the area covered by the union of the area of these two polygons. For example, a score may be represented by:

$$S = (A(M \cap B))/(A(M \cup B))$$

where:
S=score
M=template polygon
B=box frame polygon
∩=polygon intersection
∪=polygon union
A( )=area function In various embodiments, the area function (AO) may be any suitable function for calculating the area of a geometry. Using the above-identified equation, the score will always be less than or equal to 1. The higher the score, the better the fit that exists between the shape represented by the box frame and the shape represented by the template.

Referring back to FIG. 6, the system may select 612 the template associated with the highest score. In various embodiments, the system may determine 614 whether the score associated with the selected template falls below a threshold value or outside of a threshold range. For example, the system may determine 614 the score associated with the selected template lower than a threshold value. Scores that are lower than a threshold value may indicate that none of the shapes represented by the considered templates were applicable to the shape associated with the frame box. As such, if the shape associated with the selected template is used, it may result in a shape that does not accurately describe the true shape of the actor. In this case, the system may generate a warning notification to a system user.

If the system determines that the score associated with the selected template is not lower than a threshold value or is within a threshold range, the system may scale 616 the polygon represented by the selected template to best fit the box frame. The selected polygon and its scale factor may be used to set the true actor shape in the simulation.

Referring back to FIG. 5, the system may generate 510 one or more simulated tracks that includes the selected polygon scaled to its scale factor to represent the actor. The system may add 512 the one or more simulated tracks to the simulation scenario definition.

In various embodiments, a system, such as a simulator or simulation system, may run or execute 512 a simulation scenario definition in a simulated environment. During execution, one or more tracks of the simulation scenario definition may be displayed via one or more display devices. An operator of a simulator may drive a virtual vehicle in the simulator that follows the trajectory defined in the simulation scenario definition. The simulator may be programmed to collect data from the simulated environment as the vehicle moves within the simulation defined by the simulation scenario definition. The simulator or one or more electronic devices in communication with the simulator may capture this data and modify the simulation scenario definition. For example, the simulation scenario definition may be modified to be a more accurate representation of a real-world situation or environment.

FIG. 7 depicts an example of internal hardware that may be included in any of the electronic components of the system, such as internal processing systems of the AV, external monitoring and reporting systems, or remote servers. An electrical bus 700 serves as an information highway interconnecting the other illustrated components of the hardware. Processor 705 is a central processing device of the system, configured to perform calculations and logic operations required to execute programming instructions. As used in this document and in the claims, the terms "processor" and "processing device" may refer to a single processor or any number of processors in a set of processors that collectively perform a set of operations, such as a central processing unit (CPU), a graphics processing unit (GPU), a remote server, or a combination of these. Read only memory (ROM), random access memory (RAM), flash memory, hard drives and other devices capable of storing electronic data constitute examples of memory devices 725. A memory device may include a single device or a collection of devices across which data and/or instructions are stored. Various embodiments of the invention may include a computer-readable medium containing programming instructions that are configured to cause one or more processors to perform the functions described in the context of the previous figures.

An optional display interface 730 may permit information from the bus 700 to be displayed on a display device 735 in visual, graphic or alphanumeric format, such on an in-dashboard display system of the vehicle. An audio interface and audio output (such as a speaker) also may be provided. Communication with external devices may occur using various communication devices 740 such as a wireless antenna, a radio frequency identification (RFID) tag and/or short-range or near-field communication transceiver, each of which may optionally communicatively connect with other components of the device via one or more communication system. The communication device(s) 740 may be configured to be communicatively connected to a communications network, such as the Internet, a local area network or a cellular telephone data network.

The hardware may also include a user interface sensor 745 that allows for receipt of data from input devices 750, such as a keyboard or keypad, a joystick, a touchscreen, a touch pad, a remote control, a pointing device and/or microphone. Digital image frames also may be received from a camera 720 that can capture video and/or still images. The system also may receive data from a motion and/or position sensor 770 such as an accelerometer, gyroscope or inertial measurement unit. The system also may receive data from a LiDAR system 760 such as that described earlier in this document.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

An "actor" refers to a person, animal, item, object, or other things that can be perceived by an AV. Examples of actors include, without limitation, pedestrians, dogs, bicycles, other vehicles, signs, objects on a road, a curb, a sidewalk, and/or the like.

An "electronic device" or a "computing device" refers to a device that includes a processor and memory. Each device may have its own processor and/or memory, or the processor and/or memory may be shared with other devices, as in a virtual machine or container arrangement. The memory will contain or receive programming instructions that, when executed by the processor, cause the electronic device to perform one or more operations according to the programming instructions.

The terms "memory," "memory device," "data store," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

The terms "processor" and "processing device" refer to a hardware component of an electronic device that is configured to execute programming instructions. Except where specifically stated otherwise, the singular term "processor" or "processing device" is intended to include both single-processing device embodiments and embodiments in which multiple processing devices together or collectively perform a process.

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones and the like. An "autonomous vehicle" or "AV" is a vehicle having a processor, programming instructions and drivetrain components that are controllable by the processor without requiring a human operator. An autonomous vehicle may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle.

The term "pose" refers to a representation of a vehicle's location, orientation, acceleration and/or velocity.

A "track" refers to information pertaining to a state of an actor such as, for example, a location, an orientation, a shape, a velocity, an acceleration and/or the like. In various embodiments, information included as part of a track may be generated based on, at least in part, measurements obtained from one or more sensors of an AV such as, for example, one or more cameras, RADAR systems, LiDAR systems and/or the like.

A "simulation scenario definition" refers to one or more tracks obtained from one or more AV log files, one or simulated tracks that are generated based on one or more AV log files and/or an initial state of an AV.

In this document, when terms such as "first" and "second" are used to modify a noun, such use is simply intended to distinguish one item from another, and is not intended to require a sequential order unless specifically stated. In addition, terms of relative position such as "vertical" and "horizontal", or "front" and "rear", when used, are intended to be relative to each other and need not be absolute, and only refer to one possible position of the device associated with those terms depending on the device's orientation.

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

The invention claimed is:

1. A method of creating a simulation scenario definition to simulate behavior of an autonomous vehicle, the method comprising:

by a computing device:
identifying an event on which a simulation scenario definition is to be based;
identifying one or more log files associated with the event, wherein the log files comprise data that is collected by one or more sensors of an autonomous vehicle while experiencing the event and logged by the autonomous vehicle to one or more data stores;
parsing the one or more log files in a time-sequential order and populating the simulation scenario definition with information from the identified log files until an event trigger is detected;
identifying an actor from one or more of the log files;
inferring a shape of the actor by
generating a shape estimate for the actor based on track information associated with the actor,
transforming the shape estimate into a box frame having at least one of a position and orientation of the actor for each track of the one or more log files in which the actor appears,
averaging the box frames to obtain an average box frame,
classifying the actor into an object class using the average box frame, and
setting the shape of the actor to a shape associated with the object class;
generating one or more simulated tracks that includes the inferred shape for the actor; and
adding the simulated tracks to the simulation scenario definition.

2. The method of claim 1, further comprising using a simulation system to generate a data set from a simulated environment by operating a virtual vehicle in the simulated environment wherein a trajectory of the virtual vehicle is defined by the simulation scenario definition.

3. The method of claim 1, wherein populating the simulation scenario definition with information from the identified log files comprises populating the simulation scenario definition within information pertaining to a pose of the autonomous vehicle.

4. The method of claim 1, wherein populating the simulation scenario definition with information from the identified log files comprises populating the simulation scenario definition within information pertaining to a velocity of the autonomous vehicle.

5. The method of claim 1, wherein identifying an actor from one or more of the log files comprises receiving an indication of the actor from a user.

6. The method of claim 1, wherein
the average box frame represents a first polygon.

7. The method of claim 6, wherein the classifying further comprises identifying one or more templates, wherein each identified template comprises shape information pertaining to a category of object, wherein the shape information represents a second polygon.

8. The method of claim 7, wherein each identified template comprises shape information pertaining to a vehicle.

9. The method of claim 7, wherein the classifying further comprises:
comparing the average box frame to the shape information from one or more of the identified templates to generate a score that is (i) associated with the average box frame and the template and (ii) indicative of an area covered by a ratio of an intersection of the first polygon and the second polygon to an area covered by a union of an area of the first polygon and the second polygon, wherein the box frame and the template are aligned.

10. The method of claim 9, wherein the classifying further comprises selecting the identified template associated with the highest score.

11. The method of claim 10, wherein the classifying further comprises:
    determining whether the score associated with the selected template is below a threshold value, and
    in response to determining that the score associated with the selected template is below a threshold value, generating and providing a warning to a user.

12. The method of claim 10, wherein the classifying further comprises scaling the second polygon represented by the selected template to fit the average box frame.

13. A system of creating a simulation scenario definition to simulate behavior of an autonomous vehicle, the system comprising:
    a computing device; and
    a computer-readable storage medium comprising one or more programming instructions that, when executed, cause the computing device to:
        identify an event on which a simulation scenario definition is to be based;
        identify one or more log files associated with the event, wherein the log files comprise data that is collected by one or more sensors of an autonomous vehicle while experiencing the event and logged by the autonomous vehicle to one or more data stores;
        parse the one or more log files in a time-sequential order and populating the simulation scenario definition with information from the identified log files until an event trigger is detected;
        identify an actor from one or more of the log files;
        infer a shape of the actor by
            generating a shape estimate for the actor based on track information associated with the actor,
            transforming the shape estimate into a box frame having at least one of a position and orientation of the actor for each track of the one or more log files in which the actor appears,
            averaging the box frame to obtain an average box frame,
            classifying the actor into an object class using the average box frame, and
            setting the shape of the actor to a shape associated with the object class;
        generate one or more simulated tracks that includes the inferred shape for the actor; and
        add the simulated tracks to the simulation scenario definition.

14. The system of claim 13, wherein the computer-readable storage medium further comprises one or more programming instruction that, when executed, causes the computing device to use a simulation system to generate a data set from a simulated environment by operating a virtual vehicle in the simulated environment wherein a trajectory of the virtual vehicle is defined by the simulation scenario definition.

15. The system of claim 13, wherein the one or more programming instructions that, when executed, cause the computing device to populate the simulation scenario definition with information from the identified log files comprise one or more programming instructions that, when executed, cause the computing device to populate the simulation scenario definition within information pertaining to a pose of the autonomous vehicle.

16. The system of claim 13, wherein the one or more programming instructions that, when executed, cause the computing device to populate the simulation scenario definition with information from the identified log files comprise one or more programming instructions that, when executed, cause the computing device to populate the simulation scenario definition within information pertaining to a velocity of the autonomous vehicle.

17. The system of claim 13, wherein the one or more programming instructions that, when executed, cause the computing device to identify an actor from one or more of the log files comprise one or more programming instructions that, when executed, cause the computing device to receive an indication of the actor from a user.

18. The system of claim 13, wherein
    the average box frame represents a first polygon.

19. The system of claim 18, wherein the computer-readable storage medium further comprises one or more programming instructions that, when executed, cause the computing device to identify one or more templates, wherein each identified template comprises shape information pertaining to a category of object, wherein the shape information represents a second polygon.

20. The system of claim 19, wherein each identified template comprises shape information pertaining to a vehicle.

21. The system of claim 19, wherein the computer-readable storage medium further comprises one or more programming instructions that, when executed, cause the computing device to compare the average box frame to the shape information from one or more of the identified templates to generate a score that is (i) associated with the average box frame and the template and (ii) indicative of an area covered by a ratio of an intersection of the first polygon and the second polygon to an area covered by a union of an area of the first polygon and the second polygon, wherein the box frame and the template are aligned.

22. The system of claim 21, wherein the computer-readable storage medium further comprises one or more programming instructions that, when executed, cause the computing device to select the identified template associated with the highest score.

23. The method of claim 22, wherein the computer-readable storage medium further comprises one or more programming instructions that, when executed, cause the computing device to:
    determine whether the score associated with the selected template is below a threshold value, and
    in response to determining that the score associated with the selected template is below a threshold value, generate and provide a warning to a user.

24. The system of claim 22, wherein the computer-readable storage medium further comprises one or more programming instructions that, when executed, cause the computing device to scale the second polygon represented by the selected template to fit the average box frame.

25. A non-transitory computer-readable medium that stores instructions that, when executed by at least one computing device, will cause the at least one computing device to perform operations comprising:
    identifying an event on which a simulation scenario definition is to be based;
    identifying one or more log files associated with the event, wherein the log files comprise data that is collected by one or more sensors of an autonomous vehicle while experiencing the event and logged by the autonomous vehicle to one or more data stores;

parsing the one or more log files in a time-sequential order and populating the simulation scenario definition with information from the identified log files until an event trigger is detected;

identifying an actor from one or more of the log files;

inferring a shape of the actor by
  generating a shape estimate for the actor based on track information associated with the actor,
  transforming the shape estimate into a box frame having at least one of a position and orientation of the actor for each track of the one or more log files in which the actor appears,
  averaging the box frames to obtain an average box frame,
  classifying the actor into an object class using the average box frame, and
  setting the shape of the actor to a shape associated with the object class;

generating one or more simulated tracks that includes the inferred shape for the actor; and adding the simulated tracks to the simulation scenario definition.

* * * * *